(12) United States Patent
Tsai et al.

(10) Patent No.: US 12,021,031 B2
(45) Date of Patent: Jun. 25, 2024

(54) SEMICONDUCTOR PACKAGE STRUCTURE

(71) Applicant: MEDIATEK INC., Hsinchu (TW)

(72) Inventors: Yi-Lin Tsai, Hsinchu (TW); Yi-Jou Lin, Hsinchu (TW); I-Hsuan Peng, Hsinchu (TW); Wen-Sung Hsu, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 17/098,659

(22) Filed: Nov. 16, 2020

(65) Prior Publication Data

US 2021/0159177 A1 May 27, 2021

Related U.S. Application Data

(60) Provisional application No. 63/006,152, filed on Apr. 7, 2020, provisional application No. 63/006,144, filed on Apr. 7, 2020, provisional application No. 62/940,962, filed on Nov. 27, 2019.

(51) Int. Cl.
*H01L 23/538* (2006.01)
*H01L 23/00* (2006.01)

(52) U.S. Cl.
CPC ...... *H01L 23/5381* (2013.01); *H01L 23/5384* (2013.01); *H01L 23/5386* (2013.01); *H01L 24/14* (2013.01)

(58) Field of Classification Search
CPC ............ H01L 23/5381; H01L 23/5384; H01L 23/5386
See application file for complete search history.

(56) References Cited

U.S. PATENT DOCUMENTS

| | | |
|---|---|---|
| 10,224,272 B2 | 3/2019 | Kim et al. |
| 10,319,690 B2 | 6/2019 | Liao et al. |
| 10,510,631 B2 | 12/2019 | Tai et al. |
| 10,763,241 B2 | 9/2020 | Tan |
| 10,770,655 B2 | 9/2020 | Yu et al. |
| 10,804,242 B2 | 10/2020 | Yu et al. |
| 10,847,869 B2 | 11/2020 | Han et al. |
| 11,443,970 B2 | 9/2022 | Konchady et al. |

(Continued)

FOREIGN PATENT DOCUMENTS

| | | |
|---|---|---|
| CN | 105374784 A | 3/2016 |
| CN | 106486383 A | 3/2017 |

(Continued)

OTHER PUBLICATIONS

Chinese language office action dated Jul. 29, 2021, issued in application No. TW 109140056.

(Continued)

*Primary Examiner* — Errol V Fernandes
(74) *Attorney, Agent, or Firm* — McClure, Qualey & Rodack, LLP

(57) ABSTRACT

A semiconductor package structure includes a substrate, a bridge structure, a redistribution layer, a first semiconductor component, and a second semiconductor component. The substrate has a wiring structure. The bridge structure is over the substrate. The redistribution layer is over the bridge structure. The first semiconductor component and the second semiconductor component are over the redistribution layer, wherein the first semiconductor component is electrically coupled to the second semiconductor component through the redistribution layer and the bridge structure.

17 Claims, 6 Drawing Sheets

(56) References Cited

U.S. PATENT DOCUMENTS

| | | | |
|---|---|---|---|
| 11,901,334 B2 | 2/2024 | Shih | |
| 2010/0252304 A1* | 10/2010 | Muramatsu | H01L 21/563 174/251 |
| 2014/0048928 A1 | 2/2014 | Li et al. | |
| 2016/0056102 A1 | 2/2016 | Konchady et al. | |
| 2017/0033079 A1 | 2/2017 | Lin | |
| 2018/0102311 A1 | 4/2018 | Shih | |
| 2018/0315720 A1 | 11/2018 | Liao | |
| 2020/0212006 A1 | 7/2020 | Chang et al. | |
| 2020/0243450 A1* | 7/2020 | Cho | H01L 23/49822 |
| 2021/0020574 A1* | 1/2021 | Yu | H01L 21/561 |

FOREIGN PATENT DOCUMENTS

| | | |
|---|---|---|
| CN | 107689359 A | 2/2018 |
| CN | 107919343 A | 4/2018 |
| TW | 201714260 A | 4/2017 |
| TW | 201801279 A | 1/2018 |
| TW | 201839917 A | 11/2018 |
| TW | 201903994 A | 1/2019 |
| TW | 201916305 A | 4/2019 |
| WO | 2019/132965 A1 | 7/2019 |

OTHER PUBLICATIONS

Chinese language office action dated Sep. 3, 2021, issued in application No. TW 110112117.
Non-Final Office Action dated Aug. 5, 2022, issued in U.S. Appl. No. 17/208,175.
Chinese language office action date Jan. 31, 2024, issued in application No. CN 202110351228.5.

* cited by examiner

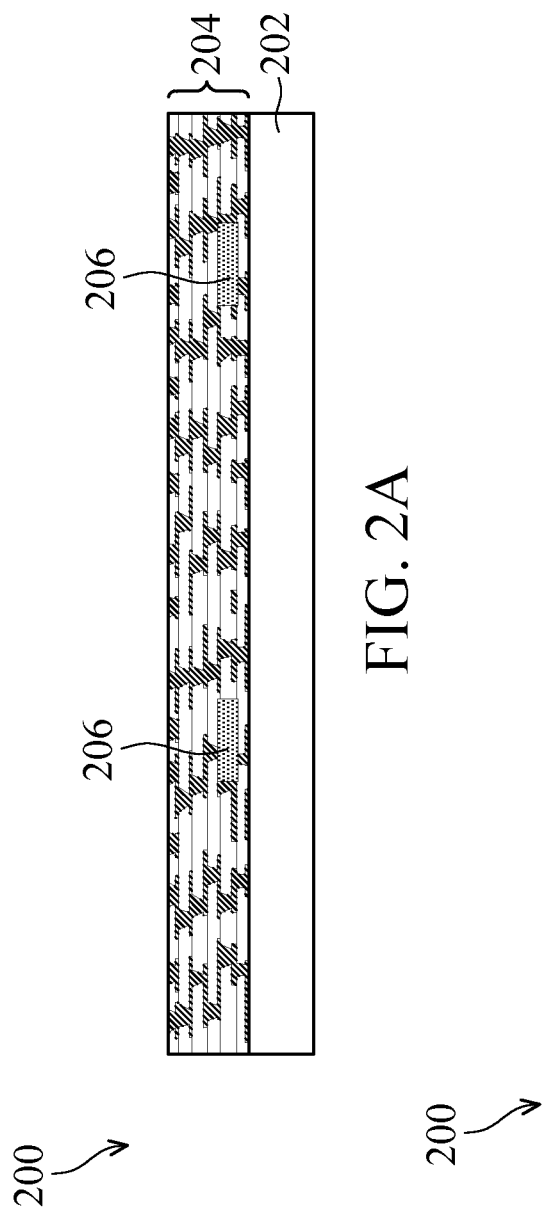
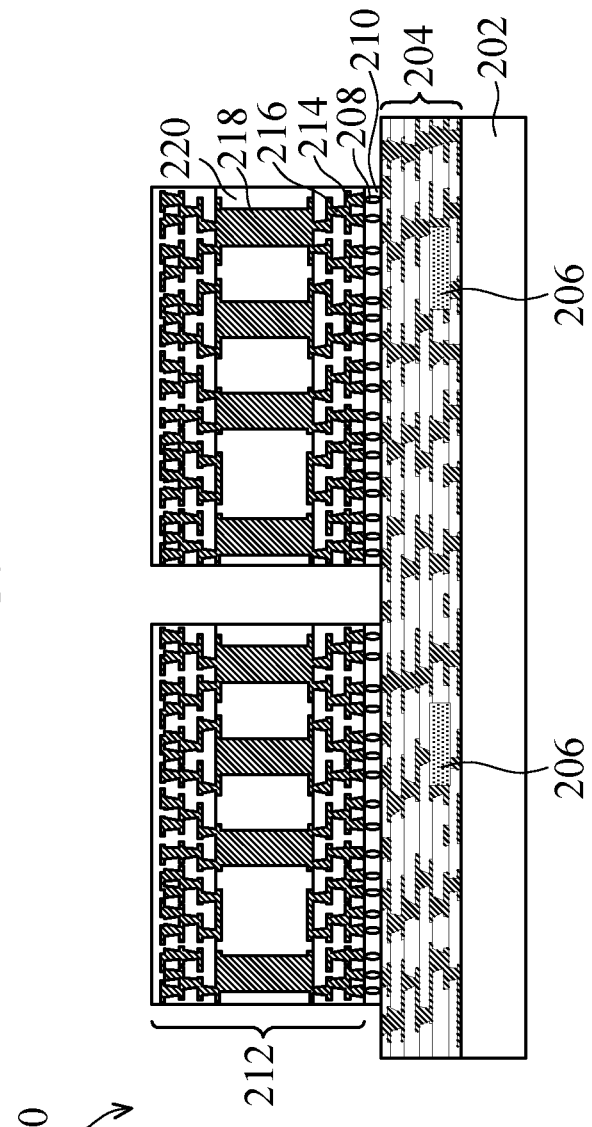

SEMICONDUCTOR PACKAGE STRUCTURE

CROSS REFERENCE TO RELATED APPLICATIONS

This application claims the benefit of U.S. Provisional Application No. 62/940,962 filed on Nov. 27, 2019, U.S. Provisional Application No. 63/006,144 filed on Apr. 7, 2020, and U.S. Provisional Application No. 63/006,152 filed on Apr. 7, 2020, the entirety of which are incorporated by reference herein.

BACKGROUND OF THE INVENTION

Field of the Invention

The present invention relates to semiconductor packaging technology, and in particular to a semiconductor package structure.

Description of the Related Art

A smaller package structure that occupies less area than previous package structures is required. One of the technology solutions is heterogeneous integration, which is to integrate multiple semiconductor dies in the same package. As such, manufacturing cost can be reduced while high performance and high density can be provided. In some package structures, an interposer or a bridge structure may be utilized to provide interconnections between the semiconductor dies.

Although existing semiconductor package structures are generally adequate, they are not satisfactory in every respect. For example, the cost of the interposer and the cost of the substrate with a bridge structure embedded therein are relatively high. Therefore, there is a need to further improve the semiconductor package structure and the method for forming the same to reduce the production cost and increase yield.

BRIEF SUMMARY OF THE INVENTION

Semiconductor package structures are provided. An exemplary embodiment of a semiconductor package structure includes a substrate, a bridge structure, a redistribution layer, a first semiconductor component, and a second semiconductor component. The substrate has a wiring structure. The bridge structure is over the substrate. The redistribution layer is over the bridge structure. The first semiconductor component and the second semiconductor component are over the redistribution layer, wherein the first semiconductor component is electrically coupled to the second semiconductor component through the redistribution layer and the bridge structure.

Another exemplary embodiment of a semiconductor package structure includes a substrate, a bridge structure, a plurality of conductive structures, a redistribution layer, a first semiconductor component, and a second semiconductor component. The substrate has a wiring structure. The bridge structure is over the substrate and has a plurality of through vias, wherein the plurality of through vias are electrically coupled to the wiring structure of the substrate. The plurality of conductive pillars are over the substrate and adjacent to the bridge structure. The redistribution layer is over the bridge structure and the plurality of conductive pillars. The first semiconductor component and the second semiconductor component are over the redistribution layer, wherein the first semiconductor component is electrically coupled to the second semiconductor component through the redistribution layer and the bridge structure.

Yet another exemplary embodiment of a semiconductor package structure includes a substrate, a redistribution layer, a bridge structure, a first semiconductor component, and a second semiconductor component. The substrate has a wiring structure. The redistribution layer is over the substrate. The bridge structure is embedded in the redistribution layer. The first semiconductor component and the second semiconductor component are over the redistribution layer, wherein the first semiconductor component is electrically coupled to the second semiconductor component through the redistribution layer and the bridge structure.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 2A to 2F are cross-sectional views of an exemplary method of forming a semiconductor package structure in accordance with some embodiments.

DETAILED DESCRIPTION OF THE INVENTION

Figure 1A:
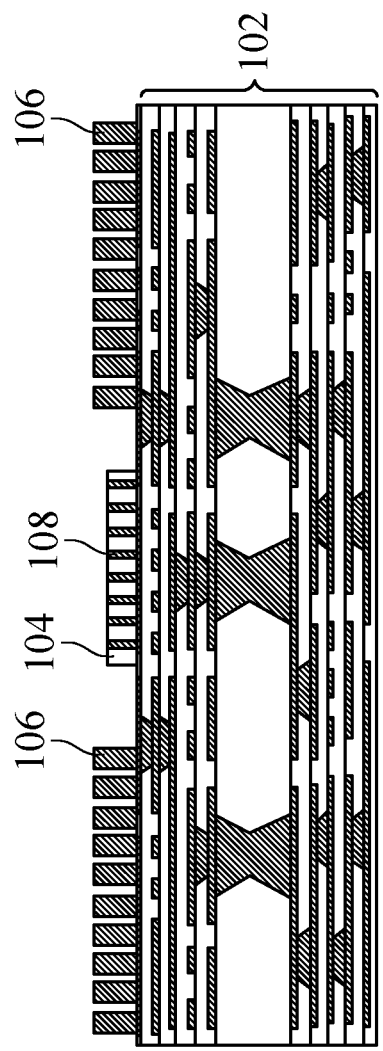
FIGS. 1A to 1D are cross-sectional views of an exemplary method of forming a semiconductor package structure in accordance with some embodiments.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

A semiconductor package structure and a method for forming the same are described in accordance with some embodiments of the present disclosure. The semiconductor package structure includes providing a bridge structure over a substrate, so that an interconnection between semiconductor components can be provided without increasing the layer counts and cost of the substrate.

FIGS. 1A to 1D are cross-sectional views of an exemplary method of forming a semiconductor package structure 100 in accordance with some embodiments of the disclosure. Additional features can be added to the semiconductor package structure 100. Some of the features described below can be replaced or eliminated for different embodiments. To simplify the diagram, only a portion of the semiconductor package structure 100 are illustrated.

As illustrated in FIG. 1A, a substrate 102 is provided, in accordance with some embodiments. In some embodiments, the substrate 102 includes an insulating core, such as a fiberglass reinforced resin core, to prevent the substrate 102 from warpage. The substrate 102 may have a wiring structure therein. In some embodiments, the wiring structure in the substrate 102 includes conductive layers, conductive vias, conductive pillars, the like, or a combination thereof. The wiring structure in the substrate 102 may be formed of metal, such as copper, aluminum, the like, or a combination thereof.

The wiring structure in the substrate 102 may be disposed in inter-metal dielectric (IMD) layers. In some embodiments, the IMD layers may be formed of organic materials, such as a polymer base material, non-organic materials, such as silicon nitride, silicon oxide, silicon oxynitride, the like, or a combination thereof. It should be noted that the configuration of the substrate 102 shown in the figures is exemplary only and is not intended to limit the present invention. Any desired semiconductor element may be formed in and on the substrate 102. However, in order to simplify the diagram, only the flat substrate 102 is illustrated.

According to some embodiments of the present disclosure, a bridge structure 104 is formed over the substrate 102 to provide an interconnection between semiconductor components and to provide an interconnection between the semiconductor components and the substrate 102.

In some other embodiments, in order to achieve these interconnections, the substrate may be formed to have a bridge structure therein. However, some associated problems are also introduced. For example, the layer count of the substrate should be increased for electrically connecting the bridge structure to the wiring in the substrate, so that the difficulty of manufacturing the substrate is increased. In addition, the process for forming the semiconductor package structure may be restricted by the manufacture of the substrate.

Therefore, in comparison with providing the substrate with a bridge structure formed therein, the bridge structure 104 formed over the substrate 102 according to some embodiments of the present disclosure can reduce the layer count of the substrate 102. The difficulty of manufacturing the substrate 102 can also be reduced. As a result, the fabrication yield of the substrate 102 can be improved, and the cost of the substrate 102 can be reduced as well. Furthermore, since the formation of the substrate 102 without a bridge structure therein is mature, flexible processes may be adopted for forming the semiconductor package structure 100 instead of limited by the manufacture of the substrate 102.

In some embodiments, the bridge structure 104 is a silicon bridge. The bridge structure 104 may include an interconnecting structure. In an exemplary embodiment, as shown in FIG. 1A, the bridge structure 104 has a plurality of through vias 108, which are electrically coupled to the wiring structure in the substrate 102. The through vias 108 may be formed of any conductive material, such as a metal. For example, the through vias 108 are formed of copper. As shown in FIG. 1A, the through vias 108 extends from the top surface of the bridge structure 104 to the bottom surface of the bridge structure 104, but the present disclosure is not limit thereto. The interconnecting structure in the bridge structure 104 may have other configurations.

In some other embodiments, the bridge structure 104 includes an interconnecting structure and one or more active and passive components, such as transistors, resistors, capacitors, inductors, or the like. The through vias 108 are optional. The bridge structure 104 may not include the through vias 108 according to some embodiments.

In some embodiments, a plurality of conductive pillars 106 are formed over the substrate 102. The conductive pillars 106 may be adjacent to the bridge structure 104. The conductive pillars 106 may be electrically coupled to the wiring structure in the substrate 102. In some embodiments, the conductive pillars 106 include metal pillars, such as copper pillars. The conductive pillars 106 may be formed by a plating process or any other suitable process. As shown in FIG. 1A, the conductive pillars 106 have substantially vertical sidewalls according to some embodiments.

The interconnecting structure, such as the through vias 108, in the bridge structure 104 may have a different pitch width than the conductive pillars 106. For example, the pitch width of the through vias 108 in the bridge structure 104 may be finer than the conductive pillars 106. A flexible routing for high-end devices and multi-function integration can thereby be achieved.

As shown in FIG. 1A, the bridge structure 104 is in the center of the top surface of the substrate 102, and the conductive pillars 106 are on opposite sides of the bridge structure 104, but the present disclosure is not limit thereto. The positions and the numbers of the bridge structure 104 and the conductive pillars 106 may be adjusted according to the routing of the semiconductor package structure 100. For example, the number of conductive pillars 106 may be different on opposite sides of the bridge structure 104. Alternatively, the conductive pillars 106 may be disposed on one side of the bridge structure 104.

Figure 1B:
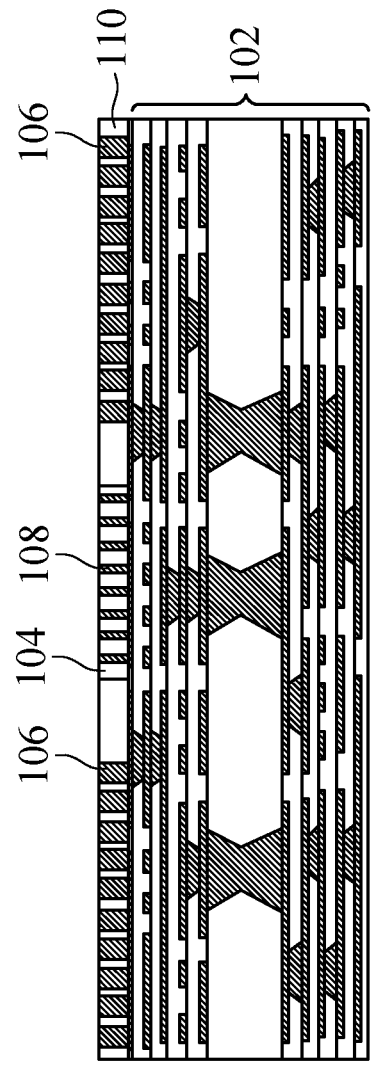

As shown in FIG. 1B, a molding material 110 is formed over the substrate 102 according to some embodiments of the present disclosure. The molding material 110 may fill in gaps between the conductive pillars 106, and between the bridge structure 104 and the conductive pillars 106. That is, the bridge structure 104 and each of the conductive pillars 106 may be surrounded by the molding material 110. The molding material 110 may adjoin the sidewalls of the bridge structure 104 and the conductive pillars 106. In some embodiments, the molding material 110 protects the bridge structure 104 and the conductive pillars 106 from the environment, thereby preventing the bridge structure 104 and the conductive pillars 106 from damage due to, for example, the stress, the chemicals and/or the moisture.

In some embodiments, the molding material 110 includes a nonconductive material, such as a moldable polymer, an epoxy, a resin, the like, or a combination thereof. In some embodiments, the molding material 110 is applied in liquid or semi-liquid form, and then is cured through any suitable curing process, such as a thermal curing process, a UV curing process, the like, or a combination thereof. The molding material 110 may be shaped or molded with a mold (not shown).

Then, the molding material 110 may be partially removed by a planarization process, such as chemical mechanical polishing (CMP), until the top surfaces of the bridge structure 104 and the conductive pillars 106 are exposed. In some embodiments, upper portions of the conductive pillars 106 are also removed during the planarization process. That is, the heights of the conductive pillars 106 may be reduced after the planarization process. The height of the bridge structure 104 may also be reduced. In some embodiments, top surfaces of the molding material 110, the bridge structure 104 and the conductive pillars 106 are substantially coplanar. The height of the bridge structure 104 may be substantially equal to the height of the conductive pillars 106.

In the embodiments where the through vias 108 are formed in the bridge structure 104, upper portions of the through vias 108 are also removed after the planarization process. In these embodiments, the height of the bridge structure 104 and the heights of the through vias 108 are substantially equal to the heights of the conductive pillars 106.

Figure 1C:
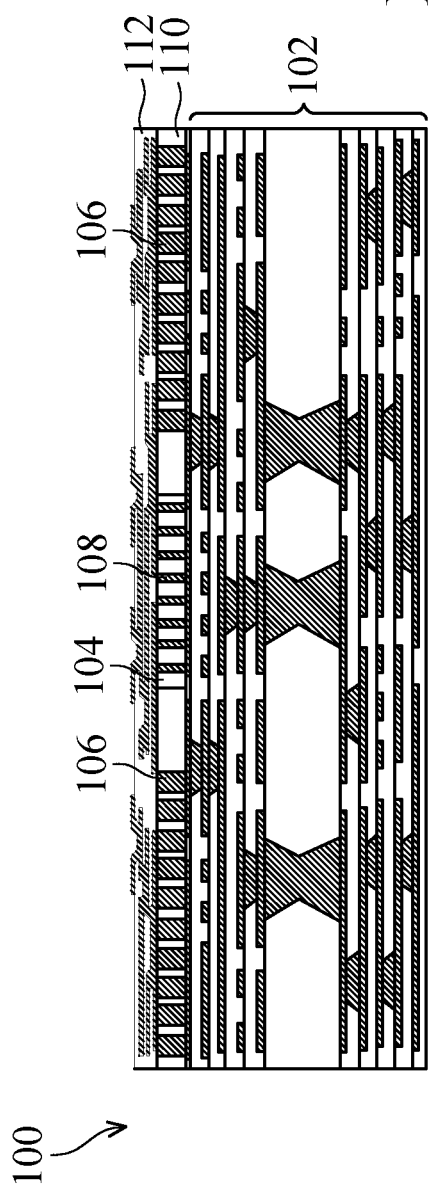

As shown in FIG. 1C, a redistribution layer 112 is formed over the bridge structure 104, the conductive pillars 106, and the molding material 110 according to some embodiments of the present disclosure. The redistribution layer 112 may include one or more metal layers and passivation layers, wherein the one or more metal layers are disposed in the one or more passivation layers. In some embodiments, the passivation layers are formed of silicon nitride, silicon carbide, silicon oxide, the like, or a combination thereof, and deposited by chemical vapor deposition (CVD), physical vapor deposition (PVD), atomic layer deposition (ALD), spin coating, the like, or a combination thereof. Layer counts of the redistribution layer 112 can be reduced since the bridge structure 104 provides the interconnection.

In some embodiments, the redistribution layer 112 is electrically coupled to the bridge structure 104 and the conductive pillars 106, and may also electrically coupled to the through vias 108. As mentioned previously, the through vias 108 in the bridge structure 104 may have a different pitch width than the conductive pillars 106. This means that the line width and spacing (L/S) of the redistribution layer 112 connected to the through vias 108 may be different than the L/S of the redistribution layer 112 connected to the conductive pillars 106. For example, in the embodiments where the pitch width of the through vias 108 in the bridge structure 104 is finer than the pitch width of the conductive pillars 106, the L/S of the redistribution layer 112 over the through vias 108 may be finer than the L/S of the redistribution layer 112 over the conductive pillars 106.

Figure 1D:
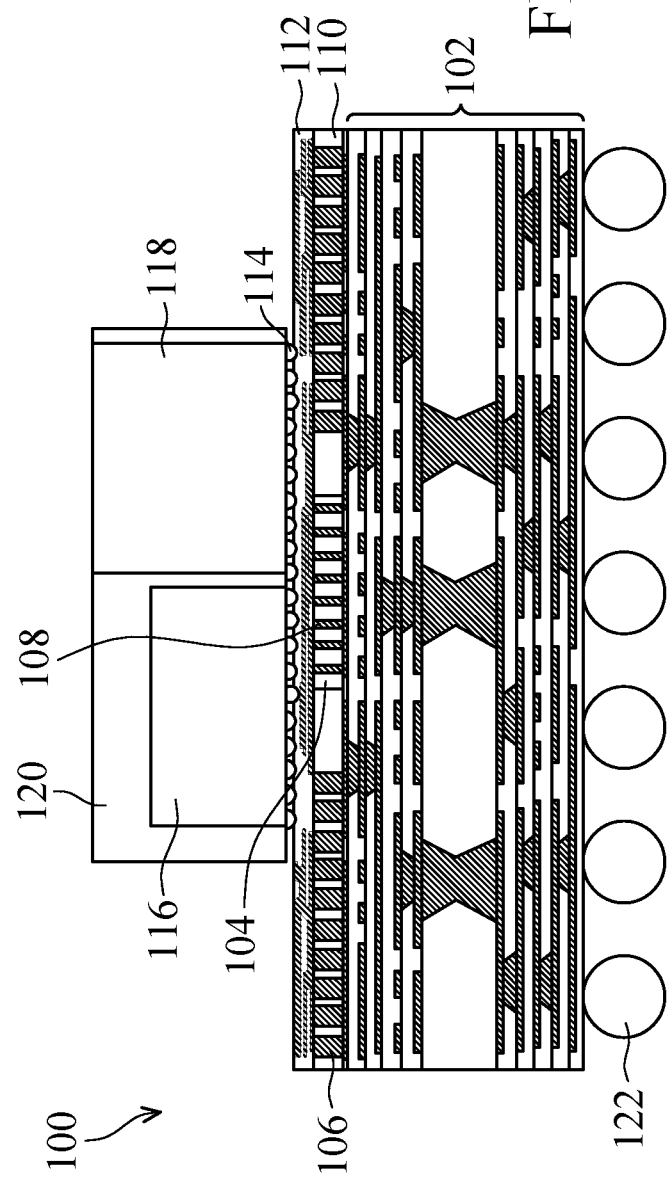

As shown in FIG. 1D, a first semiconductor component 116 and a second semiconductor component 118 are formed over the redistribution layer 112, and a plurality of conductive structures 114 are formed between the redistribution layer 112 and the first semiconductor component 116 and between the redistribution layer 112 and the second semiconductor component 118, according to some embodiments of the present disclosure. The first semiconductor component 116 and the second semiconductor component 118 may be electrically coupled to the redistribution layer 112 through the conductive structures 114.

In some embodiments, the conductive structures 114 include conductive materials, such as metal. The conductive structures 114 may include microbumps, controlled collapse chip connection (C4) bumps, ball grid array (BGA) balls, the like, or a combination thereof In some embodiments, the first semiconductor component 116 and the second semiconductor component 118 are active devices. For example, the first semiconductor component 116 and/or the second semiconductor component 118 may include a system-on-chip (SOC) die, and may each independently include a microcontroller (MCU), a microprocessor (VIPU), a power management integrated circuit (PMIC), a global positioning system (GPS) device, or a radio frequency (RF) device, the like, or any combination thereof. Alternatively, the first semiconductor component 116 and/or the second semiconductor component 118 may include a logic die, and may each independently include a central processing unit (CPU), a graphics processing unit (GPU), a dynamic random access memory (DRAM) controller, the like, or any combination thereof. The first semiconductor component 116 and the second semiconductor component 118 may include the same or different devices. In some embodiments, the first semiconductor component 116 is a SOC die, and the second semiconductor component 118 is a high bandwidth memory (HBM).

In some other embodiments, one or more passive devices are also bonded onto the redistribution layer 112, such as resistors, capacitors, inductors, the like, or a combination thereof. Although two semiconductor components, the first semiconductor component 116 and the second semiconductor component 118, are illustrated in FIG. 1D, the number of semiconductor components may be more than two.

In some embodiments, the first semiconductor component 116 is electrically coupled to the second semiconductor component 118 through the redistribution layer 112 and the bridge structure 104. The first semiconductor component 116 and the second semiconductor component 118 may be electrically coupled to the substrate 102 through the conductive structures 114, the redistribution layer 112, and the bridge structure 104. The bridge structure 104 may provide a shorter electrical connection path between the first semiconductor component 116 and the second semiconductor component 118. As shown in FIG. 1D, the bridge structure 104b is partially overlapped with the first semiconductor component 116 and the second semiconductor component 118 in a direction which is substantially perpendicular to the top surface of the substrate 102, according to some embodiments of the present disclosure. The interconnection between components which have high I/O density or components for high speed communication can thereby be achieved.

The bridge structure 104, the first semiconductor component 116, and the second semiconductor component 118 may include the same type of components or different types of components. The width of the bridge structure 104 may be substantially less than, equal to, or greater than the width of the first semiconductor component 116 or the width of the second semiconductor component 118.

In some embodiments, a molding material 120 is formed to surround the first semiconductor component 116 and the second semiconductor component 118. The molding material 120 may fill in gaps between the first semiconductor component 116 and the second semiconductor component 118. The molding material 120 may adjoin the sidewalls of the first semiconductor component 116 and the second semiconductor component 118. In some embodiments, the molding material 120 protects the first semiconductor component 116 and the second semiconductor component 118 from the environment, thereby preventing the first semiconductor component 116 and the second semiconductor component 118 from damage due to, for example, the stress, the chemicals and/or the moisture.

In some embodiments, the molding material 120 includes a nonconductive material, such as a moldable polymer, an epoxy, a resin, the like, or a combination thereof. In some embodiments, the molding material 120 is applied in liquid or semi-liquid form, and then is cured through any suitable curing process, such as a thermal curing process, a UV curing process, the like, or a combination thereof. The molding material 120 may be shaped or molded with a mold (not shown).

Then, the molding material 120 may be partially removed by a planarization process, such as chemical mechanical polishing (CMP), until the top surface of the first semiconductor component 116 or the top surface of the second semiconductor component 118 is exposed. Alternatively, both of the top surface of the first semiconductor component 116 and the top surface of the second semiconductor component 118 may be exposed or may be covered by the molding material 120.

Although the first semiconductor component 116 and the second semiconductor component 118 are surrounded by the molding material 120 as illustrated in FIG. 1D, the present disclosure is not limit thereto. For example, the first semiconductor component 116 and the second semiconductor component 118 may be surrounded by two molding materials. The molding material 120 is optional, and in some embodiments, the first semiconductor component 116 or the second semiconductor component 118 may not be surrounded by the molding material 120.

As mentioned previously, the semiconductor package structure 100 may include more than two semiconductor components. In these embodiments, more than two semiconductor components may be surrounded by the molding material 120. Alternatively, more than one molding material may be used for these semiconductor components.

In some embodiments, a plurality of conductive terminals 122 are formed below the substrate 102, and electrically coupled to the wiring structure of the substrate 102. The conductive terminals 122 may include conductive materials, such as metal. The conductive terminals 122 may include microbumps, controlled collapse chip connection (C4) bumps, ball grid array (BGA) balls, the like, or a combination thereof.

In the above embodiment, the bridge structure 104 is formed between the substrate 102 and the redistribution layer 112 to provide an interconnection between the first semiconductor component 116 and the second semiconductor component 118. As a result, layer counts of the substrate 102 and the redistribution layer 112 can be reduced. The interconnection between components which have high I/O density or components for high speed communication can also be achieved.

Moreover, in comparison with providing a substrate which has a bridge structure therein, forming the bridge structure 104 over the substrate 102 can reduce the difficulty of manufacture of the substrate 102. Therefore, the fabrication yield of the semiconductor package structure 100 can be improved, and the cost of the semiconductor package structure 100 can be reduced.

Furthermore, since the formation of the substrate 102 without the bridge structure 104 therein is mature, flexible processes may be adopted for forming the semiconductor package structure 100. In addition, since the bridge structure 104 and the conductive pillars 106 may have different pitch widths, a flexible routing for high-end devices and multi-function integration can be provided.

FIGS. 2A to 2F are cross-sectional views of an exemplary method of forming a semiconductor package structure 200 in accordance with some other embodiments. In comparison with the embodiment of FIGS. 1A to 1D, the following embodiments form a bridge structure in a redistribution layer to reduce the layer count of a substrate by another package process.

As shown in FIG. 2A, a carrier substrate 202 is provided according to some embodiments of the present disclosure. The carrier substrate 202 may be formed of silicon, glass, ceramic, or the like. In some embodiments, a redistribution layer 204 with bridge structures 206 embedded therein is formed over the carrier substrate 202. The redistribution layer 204 may include one or more metal layers and passivation layers, wherein the one or more metal layers are disposed in the one or more passivation layers. In some embodiments, the passivation layers are formed of silicon nitride, silicon carbide, silicon oxide, the like, or a combination thereof, and deposited by CVD, PVD, ALD, spin coating, the like, or a combination thereof.

In some embodiments, the bridge structures 206 are formed during the formation of the redistribution layer 204. Particularly, sidewalls of each of the bridge structures 206 may be covered by the redistribution layer 204. As shown in FIG. 2A, the redistribution layer 204 further covers top and bottom surfaces of the bridge structure 206, but the present disclosure is not limited thereto. For example, the sidewalls and top surfaces of the bridge structures 206 may be covered by the redistribution layer 204, and the bottom surfaces of the bridge structures 206 are substantially coplanar with a bottom surface of the redistribution layer 204 in some other embodiments.

As shown in FIG. 2A, the bridge structures 206 are adjacent to the bottom surface of the redistribution layer 204, but the present disclosure is not limit thereto. The bridge structures 206 may be formed adjacent to the top surface of the redistribution layer 204 or in the center of the redistribution layer 204. The bridge structures 206 may be each in different layers of the redistribution layer 204. The two bridge structures 206 as illustrated are merely examples, and the number of bridge structures 206 may be more or less than two.

In some embodiments, the bridge structures 206 provide interconnections between semiconductor components and between the semiconductor component and a substrate. The bridge structures 206 may include silicon bridges. In some embodiments, the bridge structures 206 include interconnecting structures. In an exemplary embodiment, the bridge structure 206 has a plurality of through vias (not shown), which are electrically coupled to a wiring structure in the substrate. The through vias in bridge structures 206 may be similar to the vias 108 in the bridge structure 104 as shown in FIGS. 1A to 1D, and will not be repeated. In some other embodiments, the bridge structures 206 include interconnecting structures and one or more active and passive components, such as transistors, resistors, capacitors, inductors, or the like. The configurations of the bridge structures 206 may be the same or different.

As shown in FIG. 2B, substrates 212 are formed over the redistribution layer 204, and a plurality of conductive structures 208 are formed between the redistribution layer 204 and the substrates 212, according to some embodiments of the present disclosure. The conductive structures 208 may electrically couples the substrates 212 to the redistribution layer 204. The multilayers of the redistribution layer 204 can reduce the layer count of the substrates 212. In some embodiments, the conductive structures 208 include conductive materials, such as metal. The conductive structures 208 may include microbumps, controlled collapse chip connection (C4) bumps, ball grid array (BGA) balls, the like, or a combination thereof.

In some embodiments, an underfill material 210 is formed between the substrates 212 and the redistribution layer 204, and fills in gaps between the conductive structures 208 to provide structural support. The underfill material 210 may surround each of the conductive structures 208. In some embodiments, the underfill material 210 may be dispensed with capillary force after the conductive structures 208 are formed between the substrates 212 and the redistribution layer 204. Then, the underfill material 210 may be cured through any suitable curing process. The underfill material 210 may be formed of polymer, such as epoxy. As shown in FIG. 2B, sidewalls of the underfill material 210 may be substantially coplanar with sidewalls of the substrates 212.

In some embodiments, each of the substrates 212 includes an insulating core, such as a fiberglass reinforced resin core, to prevent the substrates 212 from warpage. Each of the substrates 212 may have a wiring structure therein. As shown in FIG. 2B, the wiring structure in the substrates 212 includes conductive layers 214, conductive vias 216, and conductive pillars 218 according to some embodiments of the present disclosure.

The wiring structure in the substrate 212 may be disposed in inter-metal dielectric (IMD) layers 220. In some embodiments, the IMD layers 220 may be formed of organic materials, which include a polymer base material, non-organic materials, which include silicon nitride, silicon oxide, silicon oxynitride, the like, or a combination thereof. It should be noted that the configuration of the substrate 212 and numbers of the conductive layers 214, the conductive vias 216, the conductive pillars 218, and the IMD layers 220 shown in the figures are exemplary only and are not intended to limit the present invention. Any desired semiconductor element may be formed in and on the substrates 212. However, in order to simplify the diagram, only the flat substrates 212 are illustrated.

Figure 2C:
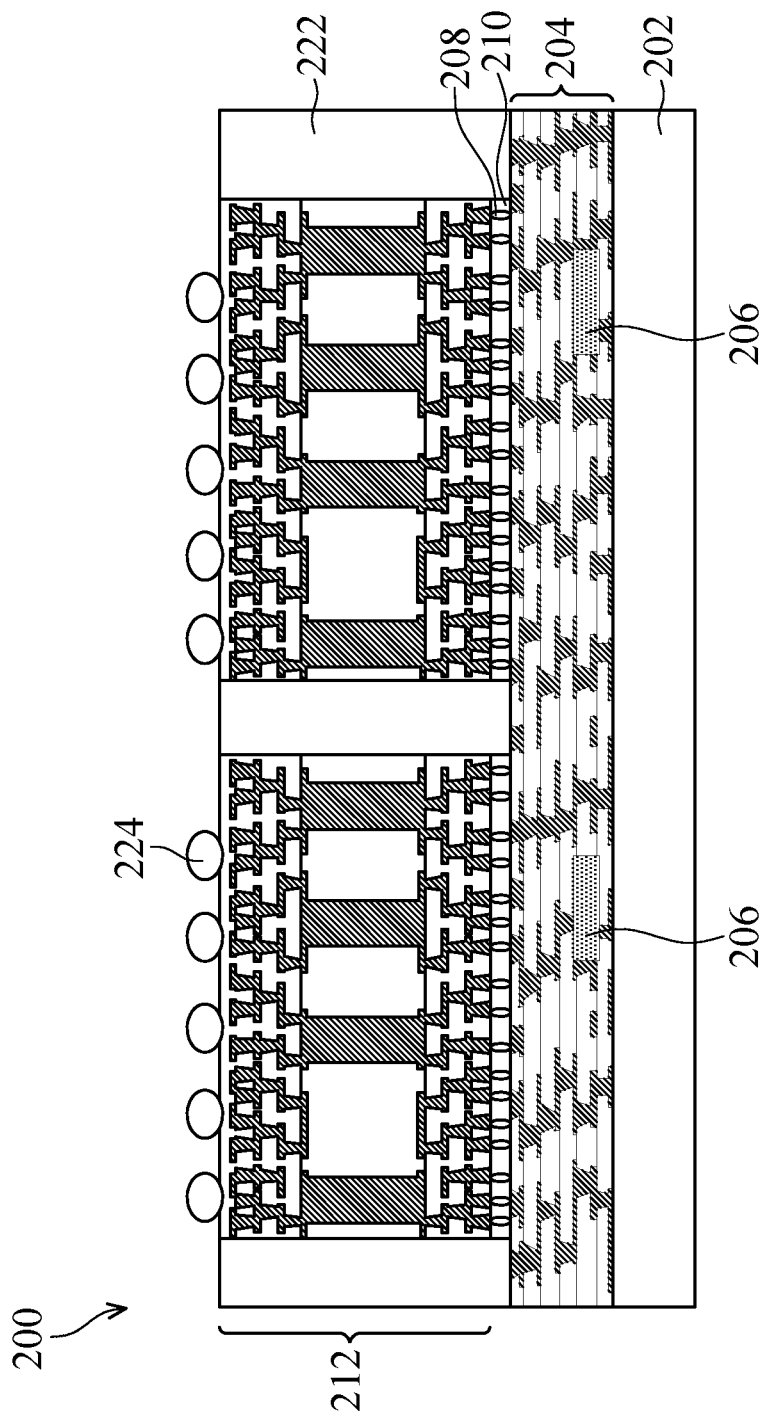

As shown in FIG. 2C, a molding material 222 is formed to surround the substrates 212 according to some embodiments of the present disclosure. The molding material 222 may fill in gaps between each of the substrates 212. The molding material 222 may protect the substrates 212 from the environment, thereby preventing the substrates 212 from damage due to, for example, the stress, the chemicals and/or the moisture. In some embodiments, sidewalls of the molding material 222 are substantially coplanar with the sidewalls of the redistribution layer 204.

In some embodiments, the molding material 222 includes a nonconductive material, such as a moldable polymer, an epoxy, a resin, the like, or a combination thereof. In some embodiments, the molding material 222 is applied in liquid or semi-liquid form, and then is cured through any suitable curing process, such as a thermal curing process, a UV curing process, the like, or a combination thereof. The molding material 222 may be shaped or molded with a mold (not shown).

Then, the molding material 222 may be partially removed by a planarization process, such as chemical mechanical polishing (CMP), until the top surfaces of the substrates 212 are exposed. In some embodiments, top surfaces of the molding material 222 and the substrates 212 are substantially coplanar.

In some embodiments, a plurality of conductive terminals 224 are formed over the substrates 212. The conductive terminals 224 may be electrically coupled to the substrates 212. In some embodiments, the conductive terminals 224 include conductive materials, such as metal. The conductive terminals 224 may include microbumps, controlled collapse chip connection (C4) bumps, ball grid array (BGA) balls, the like, or a combination thereof.

Figure 2D:
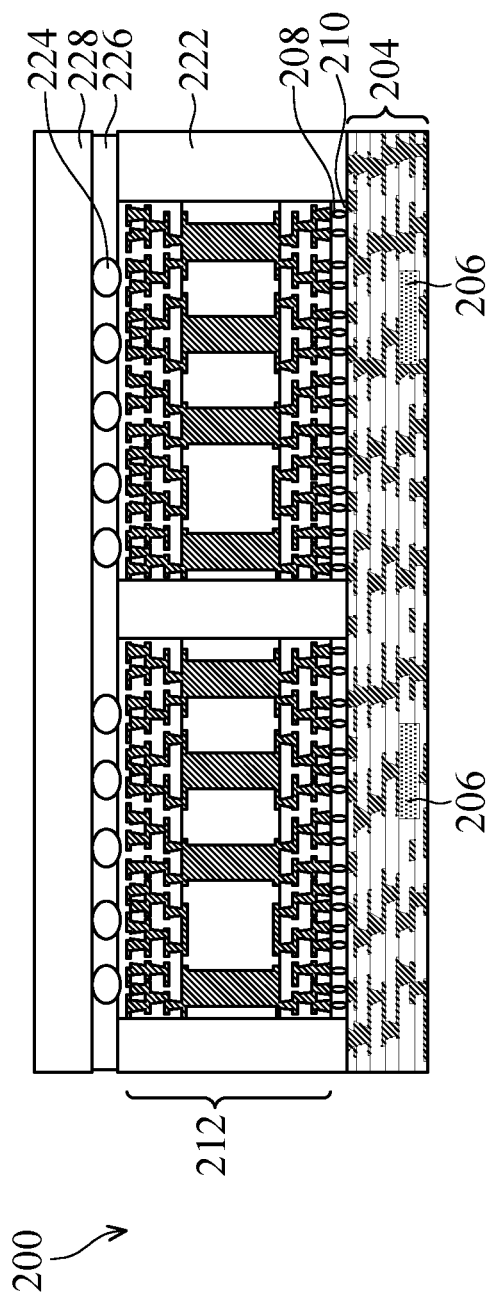

As shown in FIG. 2D, an adhesive layer 226 is applied on the surface of molding material 222 and the surface of the substrates 212, and surrounds the conductive terminals 224, according to some embodiments of the present disclosure. In some embodiments, the adhesive layer 226 includes materials which may be decomposed under the heat of light. For example, the adhesive layer 226 may be formed of a Light-to-Heat Conversion (LTHC) material or any other suitable adhesives.

Then, the semiconductor package structure 200 may be adhesive to another carrier substrate 228 through the adhesive layer 226. The carrier substrate 228 may be formed of silicon, glass, ceramic, or the like. Then, the carrier substrate 202 may be removed by a planarization process or any other suitable process, and a bottom surface of the redistribution layer 204 may be exposed. The planarization process may include a grinding process or the like.

Figure 2E:
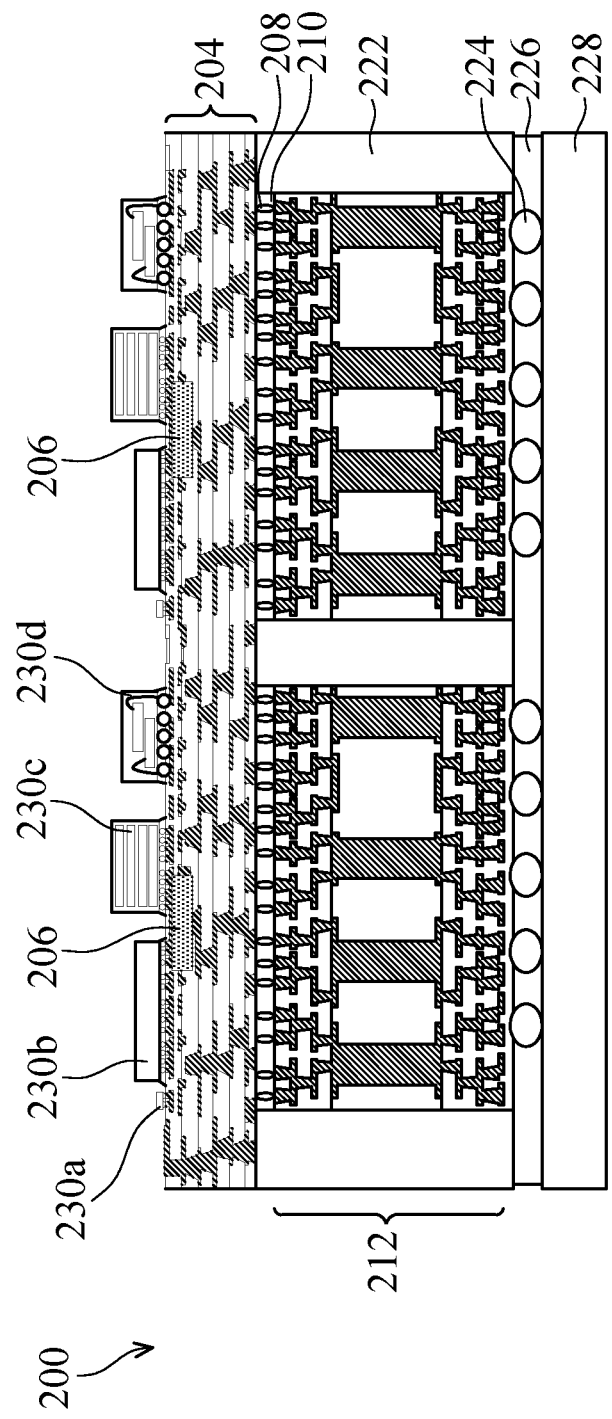

As shown in FIG. 2E, a plurality of semiconductor components 230a, 230b, 230c, and 230d are formed over the exposed surface of the redistribution layer 204 according to some embodiments of the present disclosure. The semiconductor components 230a, 230b, 230c, and 230d may be electrically coupled to the redistribution layer 204. Some of or all of the semiconductor components 230a, 230b, 230c, and 230d may be electrically coupled to each other through the redistribution layer 204 and the bridge structure 206. The bridge structure 206 may provide a shorter electrical connection path between the semiconductor components 230a, 230b, 230c, and 230d. The bridge structure 206, the semiconductor components 230a, 230b, 230c, and 230d may include the same type of components or different types of components. The width of the bridge structure 206 may be substantially less than, equal to, or greater than the widths of the semiconductor components 230a, 230b, 230c, and 230d.

In some embodiments, one or more of the semiconductor components 230a, 230b, 230c, and 230d are active devices. For example, one or more of the semiconductor components 230a, 230b, 230c, and 230d may include a system-on-chip (SOC) die, and may each independently include a microcontroller (MCU), a microprocessor (MPU), a power management integrated circuit (PMIC), a global positioning system (GPS) device, or a radio frequency (RF) device, the like, or any combination thereof. Alternatively, one or more of the semiconductor components 230a, 230b, 230c, and 230d may include a logic die, and may each independently include a central processing unit (CPU), a graphics processing unit (GPU), a dynamic random access memory (DRAM) controller, the like, or any combination thereof. In some other embodiments, one or more of the semiconductor components 230a, 230b, 230c, and 230d include passive devices, such as resistors, capacitors, inductors, the like, or a combination thereof.

The semiconductor components 230a, 230b, 230c, and 230d may include the same or different devices. In some embodiments, the semiconductor component 230a is a multilayer ceramic capacitor (MLCC), the semiconductor component 230b is SOC die, the semiconductor component 230c is a high bandwidth memory (HBM), and the semiconductor component 230d is a DRAM.

The four semiconductor components, the semiconductor components 230a, 230b, 230c, and 230d, are merely examples, and the number of semiconductor components may be more or less than four. Although the number and the configuration of the semiconductor components 230a, 230b, 230c, and 230d are similar for the two substrates 212, the present disclosure is not limit thereto. The number and the configuration of semiconductor components 230a, 230b, 230c, and 230d may be different for each of the substrates 212.

In some embodiments, a plurality of conductive structures and underfill materials are formed between the semiconductor components 230a, 230b, 230c, and 230d and the redistribution layer 204, wherein the underfill materials fill in gaps between the conductive structures. The semiconductor components 230a, 230b, 230c, and 230d may be electrically coupled to the redistribution layer 204 through the conductive structures. The conductive structures and the underfill materials may be similar to the conductive structures 208 and the underfill material 210, and will not be repeated.

Figure 2F:
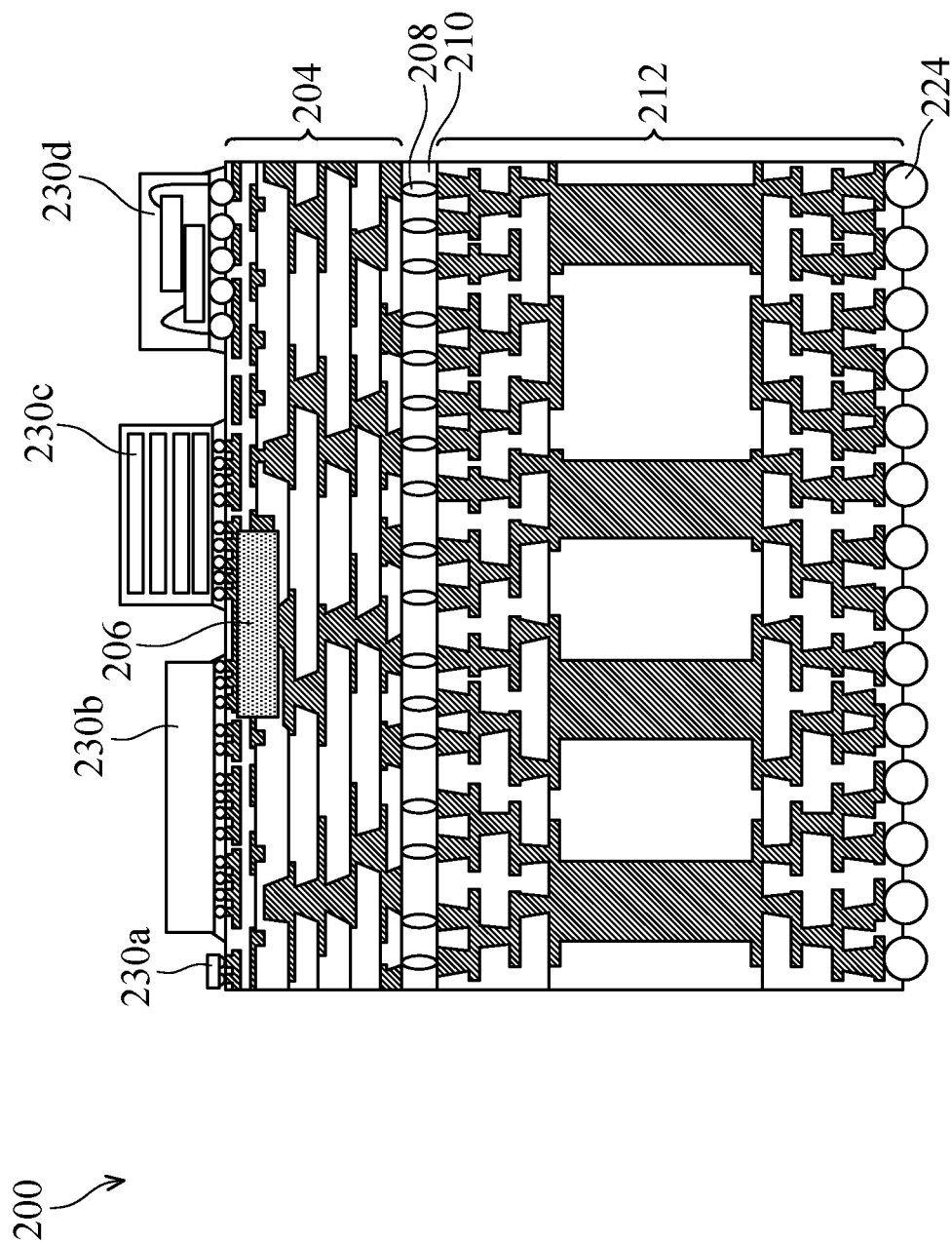

As shown in FIG. 2F, the semiconductor package structure 200 is divided into separate portions, and the carrier substrate 228 and the adhesive layer 226 are removed by a de-bonding process, according to some embodiments of the present disclosure. In some embodiments, the de-bonding is performed by projecting a UV light or a laser on adhesive layer 226. The heat generated from the light or laser may cause the adhesive layer 226 to be decomposed, and hence the carrier substrate 228 may be detached from the conductive terminals 224.

As shown in FIG. 2F, the bridge structure 206 is partially overlapped with the semiconductor components 230b and 230c in a direction which is substantially perpendicular to the top surface of the substrate 212, according to some embodiments of the present disclosure. The interconnection between components which have high I/O density or components for high speed communication can thereby be achieved.

In the above embodiments, the bridge structure 206 is formed in the redistribution layer 204 to provide an interconnection between some of or all of the semiconductor components 230a, 230b, 230c, and 230d. As a result, layer counts of the substrate 212 can be reduced, and the difficulty of manufacturing the substrate 212 may also be reduced. In addition, the interconnection between components which have high I/O density or components for high speed communication can be achieved. The redistribution layer 204, which has multiple layers, further reduces the layer counts of the substrate 212, according to some embodiments. Therefore, the fabrication yield of the semiconductor package structure 200 can be improved, and the cost of the semiconductor package structure 200 can be reduced.

Although the bridge structure 104 is between the substrate 102 and the redistribution layer 112 for the semiconductor package structure 100, and the bridge structure 206 is in the redistribution layer 204 for the semiconductor package structure 200, the present disclosure is not limit thereto. For example, the redistribution layer 112 of the semiconductor package structure 100 may be formed with another bridge structure therein, with reference to the description in FIGS. 2A to 2F. Alternatively, the conductive structures 208 may include a bridge structure, and may also include conductive pillars, with reference to the description in FIGS. 1A to 1D.

In summary, the present disclosure provides one or more bridge structures over a substrate to provide an interconnection between semiconductor components and an interconnection between the semiconductor components and the substrate. As a result, layer counts of the substrate can be reduced. Thus, the difficulty of manufacturing the substrate can be reduced. In some embodiments, layer counts of the redistribution layer can also be reduced. Accordingly, the fabrication yield of the semiconductor package structure can be improved, and the cost of the semiconductor package structure can be reduced.

Furthermore, in comparison with a substrate having a bridge structure therein, the manufacture of a substrate without the bridge structure is mature. Therefore, flexible processes may be adopted for forming the semiconductor package structure. In some embodiments, the pitch width of the interconnecting structure in the bridge structure is different than that of other components, such as the conductive pillars, thereby providing a flexible routing for high-end devices and multi-function integration. In addition, the interconnection between components which have high I/O density or components for high speed communication can also be achieved, according to some embodiments of the present disclosure.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
 a substrate comprising an upper portion, a lower portion, and a first conductive pillar, wherein the upper portion has a first conductive layer and a first conductive via, the lower portion has a second conductive layer and a second conductive via, and the first conductive pillar connects the first conductive layer to the second conductive layer;
 a bridge structure over the substrate and having a plurality of through vias;
 a molding material;
 a redistribution layer over the bridge structure;
 a plurality of second conductive pillars between the redistribution layer and the substrate; and
 a first semiconductor component and a second semiconductor component over the redistribution layer, wherein the first semiconductor component is electrically coupled to the second semiconductor component through the redistribution layer and the bridge structure,
 wherein top surfaces of the molding material, the bridge structure and the plurality of second conductive pillars are substantially coplanar,
 wherein the plurality of through vias have a finer pitch width than a pitch width of the plurality of second conductive pillars.

2. The semiconductor package structure as claimed in claim 1, wherein the bridge structure and the plurality of second conductive pillars are surrounded by the molding material.

3. The semiconductor package structure as claimed in claim 1, wherein the plurality of through vias are electrically coupled to the redistribution layer and the substrate.

4. The semiconductor package structure as claimed in claim 1, wherein the first semiconductor component and the second semiconductor component are surrounded by a second molding material.

5. The semiconductor package structure as claimed in claim 1, further comprising a plurality of conductive structures between the redistribution layer and the first semiconductor component and between the redistribution layer and the second semiconductor component, wherein the plurality of conductive structures are electrically coupled to the redistribution layer.

6. The semiconductor package structure as claimed in claim 1, further comprising a plurality of conductive terminals below the substrate, wherein the plurality of conductive terminals are electrically coupled to the substrate.

7. The semiconductor package structure as claimed in claim 1, wherein the bridge structure is partially overlapped with the first semiconductor component and the second semiconductor component.

8. The semiconductor package structure as claimed in claim 1, further comprising another bridge structure embedded in the redistribution layer and electrically coupled to the redistribution layer.

9. A semiconductor package structure, comprising:
 a substrate comprising an upper portion, a lower portion, and a conductive pillar, wherein the upper portion has a first conductive layer and a first conductive via, the lower portion has a second conductive layer and a second conductive via, and the conductive pillar connects the first conductive layer to the second conductive layer;

a bridge structure over the substrate and having a plurality of through vias, wherein the plurality of through vias are electrically coupled to the substrate;

a plurality of second conductive pillars over the substrate and adjacent to the bridge structure;

a redistribution layer over the bridge structure and the plurality of second conductive pillars;

a molding material; and a first semiconductor component and a second semiconductor component over the redistribution layer, wherein the first semiconductor component is electrically coupled to the second semiconductor component through the redistribution layer and the bridge structure, wherein top surfaces of the molding material, the bridge structure and the plurality of second conductive pillars are substantially coplanar, wherein the plurality of through vias have a finer pitch width than a pitch width of the plurality of second conductive pillars.

10. The semiconductor package structure as claimed in claim 9, wherein the plurality of through vias have a height that is substantially equal to a height of the plurality of second conductive pillars.

11. A semiconductor package structure, comprising:

a substrate comprising an upper portion, a lower portion, and a conductive pillar, wherein the upper portion has a first conductive layer and a first conductive via, the lower portion has a second conductive layer and a second conductive via, and the conductive pillar connects the first conductive layer to the second conductive layer;

a redistribution layer over the substrate;

a plurality of conductive structures between the redistribution layer and the substrate and electrically coupling the redistribution layer and the substrate;

an underfill material surrounding each of the plurality of conductive structures and having a sidewall substantially coplanar with a sidewall of the substrate and a sidewall of the redistribution layer;

a bridge structure embedded in the redistribution layer; and a first semiconductor component and a second semiconductor component over the redistribution layer, wherein the first semiconductor component is electrically coupled to the second semiconductor component through the redistribution layer and the bridge structure, wherein a bottom surface of the bridge structure is substantially coplanar with a bottom surface of the redistribution layer.

12. The semiconductor package structure as claimed in claim 11, wherein the bridge structure has a plurality of through vias, and the plurality of through vias are electrically coupled to the redistribution layer.

13. The semiconductor package structure as claimed in claim 11, wherein the redistribution layer has a greater thickness than the bridge structure.

14. The semiconductor package structure as claimed in claim 11, wherein the bridge structure is partially overlapped with the first semiconductor component and the second semiconductor component.

15. The semiconductor package structure as claimed in claim 11, further comprising:

a plurality of conductive terminals below the substrate, wherein the plurality of conductive terminals are electrically coupled to the substrate.

16. The semiconductor package structure as claimed in claim 15, wherein the bridge structure is electrically coupled to the plurality of conductive terminals through the redistribution layer, the plurality of conductive structures, and the substrate.

17. The semiconductor package structure as claimed in claim 11, wherein the redistribution layer comprises a plurality of conductive vias, and a width of the conductive vias increases towards the underfill material.

* * * * *